United States Patent [19]

Ashtiani et al.

[11] Patent Number: 6,083,363
[45] Date of Patent: Jul. 4, 2000

[54] APPARATUS AND METHOD FOR UNIFORM, LOW-DAMAGE ANISOTROPIC PLASMA PROCESSING

[75] Inventors: Kaihan Abidi Ashtiani, Nanvet; James Anthony Seirmarco, Buchanan, both of N.Y.

[73] Assignee: Tokyo Electron Limited, Tokyo, Japan

[21] Appl. No.: 08/887,140

[22] Filed: Jul. 2, 1997

[51] Int. Cl.[7] .................................................. C23C 14/34
[52] U.S. Cl. ...................... 204/298.01; 216/79; 216/74; 216/58
[58] Field of Search ............... 156/345; 216/68, 216/79, 74, 58; 204/298.01

[56] References Cited

U.S. PATENT DOCUMENTS

| 4,717,462 | 1/1988 | Homma et al. . |
| 4,792,378 | 12/1988 | Rose et al. . |
| 4,925,542 | 5/1990 | Kidd . |
| 4,963,239 | 10/1990 | Shimamura et al. . |
| 5,010,842 | 4/1991 | Oda et al. . |
| 5,052,339 | 10/1991 | Vakerlis et al. . |
| 5,108,535 | 4/1992 | Ono et al. ............................... 156/345 |
| 5,273,588 | 12/1993 | Foster et al. . |
| 5,284,544 | 2/1994 | Mizutani et al. ........................ 156/345 |
| 5,330,628 | 7/1994 | Demaray et al. . |
| 5,431,799 | 7/1995 | Mosely et al. . |
| 5,433,787 | 7/1995 | Suzuki et al. . |
| 5,811,022 | 9/1998 | Savas et al. ............................... 216/68 |

FOREIGN PATENT DOCUMENTS

| 0 735 577 A2 | 10/1996 | European Pat. Off. . |
| 53-91664 | 11/1978 | Japan . |
| 60-116126 | 6/1985 | Japan . |
| 62-77477 | 4/1987 | Japan . |
| 63-187619 | 8/1988 | Japan . |

OTHER PUBLICATIONS

Rossnagel, S.M., "Directional and preferential sputtering–based physical vapor deposition," Thin Solid Films, 263, (1995) 1–12, Elsevier Science S.A.

Yoshio Homma, Sukeyoshi Tunekawa, Akira Satou, and Tomoguki Terada, "Planarization Mechanism of RF–Biased Al Sputtering," J. of Electrochem. Soc., 140 (1993) Mar., No. 3, Manchester, NH, U.S.

*Primary Examiner*—Thi Dang
*Assistant Examiner*—Rudy Zervigon
*Attorney, Agent, or Firm*—Wood, Herron & Evans, LLP

[57] ABSTRACT

An apparatus and method for processing the surface of a substrate with a plasma formed from a process gas comprises a processing chamber defining a plasma source region and a processing region wherein electrical energy is coupled into the source region to form and sustain a plasma therein, and an ion extraction mechanism positioned between the source region and processing region for extracting ions from the plasma and directing extracted ions and neutral particles into the processing region to process a biased substrate therein. A gas-dispersing element in the processing space disperses a process gas to intersect paths of the extracted ions and to produce charge exchange collisions to create a large number of high-energy neutral particles for processing the workpiece. A radiation-blocking apparatus is positioned between the plasma source region and processing region proximate the ion extraction mechanism and is operable for absorbing damaging radiation produced by the plasma to reduce radiation damage to the substrate.

21 Claims, 3 Drawing Sheets

APPARATUS AND METHOD FOR UNIFORM, LOW-DAMAGE ANISOTROPIC PLASMA PROCESSING

FIELD OF THE INVENTION

The present invention relates to plasma processing for integrated circuit (IC) fabrication, and more specifically, to a method and apparatus for uniform, low-damage anisotropic processing of a substrate for the production of VLSI and ULSI circuits.

BACKGROUND OF THE INVENTION

In the processing of semiconductor substrates, or wafers, into integrated circuits (IC), gaseous plasmas are widely utilized. For example, gaseous plasmas are used to process substrates via etching, deposition, or other similar such procedures. One such plasma procedure which has found increasing application in semiconductor processing, particularly in IC fabrication such as ion implantation, sputter etching, and deposition, is a procedure which utilizes a high-density plasma source for yielding fast processing rates. High-density plasmas are desirable in the manufacturing of very large scale integrated "VLSI" and ultra large scale integrated "ULSI" circuits, having diameters up to 300 mm.

For high-density plasma processing, the substrate is positioned in a chamber on an electrically charged support base or electrode for biasing the substrate. The chamber is vacuumed to a low pressure, such as 50 mTorr or less. A process gas or work gas is then introduced into the chamber opposite the biased substrate. RF energy is inductively coupled to the gas for example, utilizing an induction coil coupled to an RF power supply. The induction coil creates a time-varying magnetic field around itself at the frequency of the applied RF energy, and the magnetic field in turn induces an electric field in the chamber. The energy from the induced electric field inside the chamber ionizes the process gas particles to form a gaseous plasma (or glow discharge) which comprises, among other particles, positively charged ions of the process gas. A negatively biased substrate collects the positively charged ion particles from the plasma to process the wafer, such as through etching or deposition. For example, the positively charged plasma ions might be attracted to the negatively biased substrate surface to bombard the surface and dislodge material particles from the substrate to thereby sputter etch a material layer from the substrate surface.

Notwithstanding the increased popularity of high-density plasma sources and their increased application to semiconductor processing, existing high-density plasma apparatus and methods have several drawbacks. For example, semiconductor wafers processed utilizing high-density plasmas are particularly sensitive to ion damage associated with the high energy of the ion particles bombarding the surface of the substrate. High-energy ions may implant into surface of the substrate to an undesirable degree or may create charge flow within the IC devices being processed on the substrate, thus damaging those devices or changing their conductive characteristics. Such ionic damage is exacerbated by the high density of the plasma. Therefore, it is desirable to reduce the damage of the substrate attributable to ionic bombardment and charging in high-density plasmas.

Another drawback of high-density plasmas is the large amount of ultraviolet (UV) radiation which is generated by the plasma. UV rays of the plasma strike the substrate and enter the oxide layers of the substrate to create charges which may migrate into the gate regions of the IC devices. Alternatively, the charges might actually be created in the gate regions of the devices by the radiation. The created charges degrade the gate regions and may change the electrical characteristics of the device. Furthermore, the undesirable UV radiation may create charges which migrate to or are located in the interfaces of the devices to create undesirable interfacial charge states which also change the electrical characteristics of the device. Still further, minority carrier action is changed by the damaging radiation which further degrades the characteristics of the IC devices and the yield from the processed substrate. Accordingly, it is desirable to reduce the effect of the damaging UV radiation, and other radiation from the high-density plasma.

As with most plasma applications, particularly plasma etching, it is desirable to control the plasma to further control the etch and direct the etch where it is required on the substrate. To that end, it is also desirable to directionalize the etch produced from high-density plasmas for advanced etching applications. Such directed or focused processing, referred to as anisotropic processing, is particularly applicable for narrow, high-aspect ratio structures which need to be etched for subsequent deposition thereon. The vertical characteristics of anisotropic etching allow deeper, cleaner etching of narrow circuit structures. Therefore, anisotropic processing for the manufacturing of VLSI and ULSI circuits is certainly a desirable feature for high-density plasma processing.

Accordingly, it is an objective of the present invention to provide low-damage processing of semiconductor materials for forming VLSI and ULSI circuits.

Another objective of the present invention is to provide a uniform, high-density plasma which may be utilized for high rate processing of VLSI and ULSI circuits without subsequent damage of the devices therein.

It is another objective of the present invention to provide a high-density, anisotropic plasma for directional etching of narrow, high aspect ratio structures on a substrate.

It is still a further objective of the present invention to utilize a high-density plasma source while reducing radiation damage of the devices on the substrate being processed.

It is a further objective of the present invention to reduce the ion damage of substrates processed utilizing high-density plasmas.

SUMMARY THE INVENTION

The present invention addresses the above-discussed objectives and provides low-damage processing of semiconductor materials utilizing a uniform, high-density plasma. The present invention reduces radiation damage of semiconductor devices and provides a high-density, anisotropic plasma for directional etching of narrow, high-aspect ratio IC structures.

More specifically, the invention comprises a processing chamber defining a plasma source region and a plasma processing region therein, wherein the plasma processing region is located downstream of the source region. The processing region includes a susceptor or other mounting structure for supporting a workpiece or substrate within the processing chamber. Process gas is introduced into the source region, and electrical energy is coupled into the source region to form and sustain a plasma therein. In a preferred embodiment of the invention, electrical energy is inductively coupled into the source region utilizing a RF biased coil proximate the source region and an adjacent dielectric window for passing the inductive energy into the source region.

An ion extraction or directing mechanism is positioned between the source region and the processing region and is operable, when biased with electrical energy, for extracting and directing ions from the plasma in the source region and directing high-energy extracted ions into the processing region for bombarding the substrate for etching. The ion extraction mechanism, in one embodiment, comprises a conductive plate, such as a stainless steel plate, having a number of small apertures formed therein to allow for passage of plasma species from the source region to the processing region. A DC power supply can be used to negatively bias the extraction plate. The apertures of the plate are dimensioned to interfere minimally with the plasma particles so that a suitable amount of the ions extracted from the source region are delivered to the processing region to process the substrate. Alternatively, the ion extraction mechanism may comprise a set of conductive wires, such as stainless steel wires, cross-meshed to form a grid. In the embodiment, the grid hole size of the ion extraction mechanism is sufficiently large so as not to interfere substantially with the plasma to allow for free passage of plasma species therethrough into the processing region. The grid can also be negatively biased with a DC power supply. Preferably, the grid or plate is generally planar and is positioned in between the source region and processing region, generally parallel to the substrate being processed. The substrate is DC or RF biased, or pulsed, for attracting the extracted ions. To further focus, intensify, and direct the plasma, magnetic bucket structures might be utilized around the source region.

In accordance with another aspect of the present invention, the population of high-energy directed neutral species available for etching of the substrate is increased. To that end, the invention further comprises a gas-dispersing or gas introduction element positioned in the processing space downstream of the plasma source region and downstream of the ion extraction mechanism. The gas-dispersing element, such as a gas feed ring, disperses a process gas into the processing region to intersect the paths of the high-energy extracted ions which are traveling to the biased substrate. The charge-exchange collisions between the introduced neutral process gas particles and the high-energy ions in the processing region produce a population of directed neutral which are generally perpendicular to the substrate surface. Therefore, the processing, such as etching, of the substrate is highly directionalized or anisotropic. Thereby, the invention provides anisotropic and directional etching which is particularly suitable for narrow, high-aspect ratio IC structures.

In accordance with another aspect of the present invention, a radiation blocking apparatus, and preferably a radiation blocking plate, is positioned between the plasma source region and the processing region. In the preferred embodiment, the radiation blocking plate is positioned generally parallel to, and between, the ion extraction mechanism and the substrate being processed. The radiation blocking plate has a plurality of apertures formed therein for passing plasma from the source region and into the processing region, while absorbing plasma radiation. The plate is formed of a radiation absorbing material, such as quartz, and is operable for absorbing radiation generated by the plasma, such as X radiation and UV radiation. By reducing the exposure of the devices on the substrate to the plasma radiation, damage to the devices being processed is reduced. The blocking plate preferably interferes with the extracted plasma particles very minimally.

The present invention thus provides plasma processing utilizing a high-density and directional plasma while reducing damage to the substrate or workpiece attributable to high-energy ions and plasma radiation. The directional or anisotropic processing of the present invention is particularly useful for etching of narrow high-aspect ratio structures. The invention is particularly suitable for sputter etching, but may also be utilized for reactive etching and/or deposition. Further objectives of the present invention and its improvements over the prior art will become more readily apparent from the detailed description hereinbelow.

BRIEF DESCRIPTION OF THE DRAWINGS

The accompanying drawings, which are incorporated in and constitute a part of this specification, illustrate embodiments of the invention and, together with a description of the invention given below, serve to explain the principles of the invention.

DETAILED DESCRIPTION OF THE DRAWINGS

Figure 1:
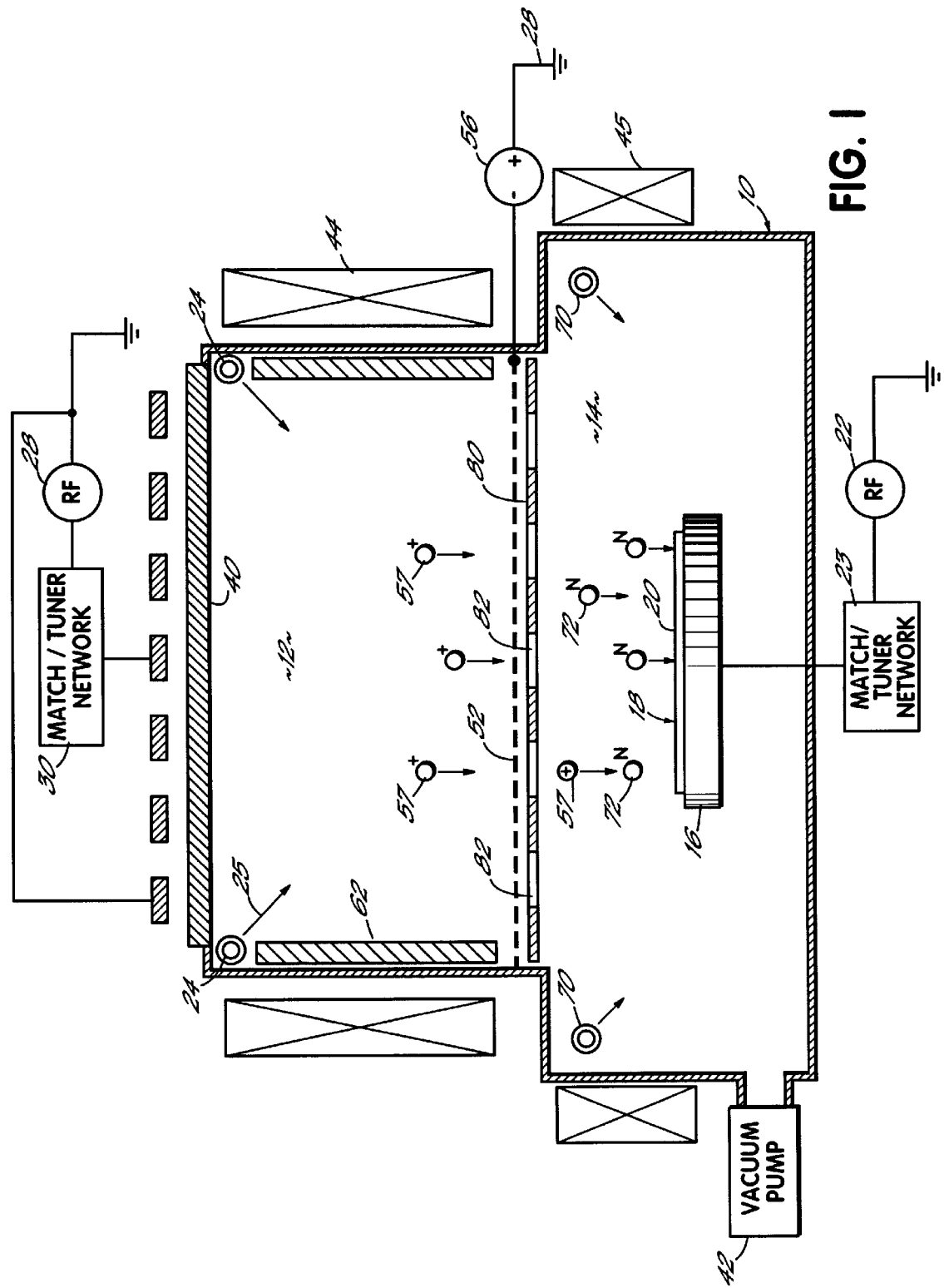
FIG. 1 is a schematic cross-sectional view of the reaction chamber of the present invention.

FIG. 1 illustrates one embodiment of the inventive apparatus for processing a semiconductor substrate utilizing a high-density plasma in accordance with the principles of the present invention. The apparatus includes a processing chamber 10 appropriately formed of a non-magnetic material, such as aluminum, for producing a vacuum environment and containing a plasma therein to process a substrate. The processing chamber 10 defines a plasma source region 12 and a processing region 14, which is downstream from the source region. Processing region 14 includes a susceptor or other substrate support 16 for supporting a workpiece or substrate 18, such as a semiconductor wafer. Susceptor 16 may be stationary or rotating and should secure the substrate 18 thereon, such as by physical clamping or a non-clamping device such as an electrostatic chuck, both of which are known in the art. Substrate 18 is maintained in the processing region 14 with an upper surface 20 generally facing source region 12. Susceptor 16 is preferably coupled to an RF power source 22 for biasing substrate 18 for processing as discussed further hereinbelow.

For processing substrate 18, process gas or plasma gas, such as Argon, is introduced into the source region 12 through an appropriate mechanism, such as a gas feed ring 24, which encircles the source region generally around an upper portion thereof. Feed ring 24 has a plurality of passages (not shown) formed therearound for directing process gas into the source region as indicated by arrows 25. Once plasma gas is introduced into source region 12, electrical energy is coupled into the source region for exciting the gas into a plasma discharge containing a plurality of positively charged ions, free electrons, and other plasma species. In a preferred embodiment of the invention, the electrical energy is preferably inductively coupled into source region 12 by an RF-biased coil structure which has a number of concentric loops forming a spiral or multiple spirals. There are suitable examples of such RF coils illustrated and disclosed in U.S. Pat. No. 5,556,521, and U.S. patent application Ser. No. 08/624,010, which is co-pending herewith, both patent and application being co-owned with the present application, and both patent and application being incorporated herein by reference in their entireties. Such inductively coupled plasmas have a high density and are finding increasing application for fast rate processing, which is desirable in the manufacturing of VLSI circuits and ULSI circuits. The plasmas are generally very uniform and thus are suitable for providing a uniform etch or deposition over the substrate surface being processed.

Inductive coil 26 is biased by an RF power supply 28, which is coupled to the coil through a match/tuner network 30. The RF power supply 28 may be operated in pulse or continuous mode and the match/tuner network 30 provides for maximum power transfer from the power supply to the coil 26. Frequency range of supply 28 can vary from 1–13.56 MHZ, although higher and lower frequencies may also be applicable. The plasma density created as the result of the RF power will vary depending on the frequency of the operation.

Figure 2A:
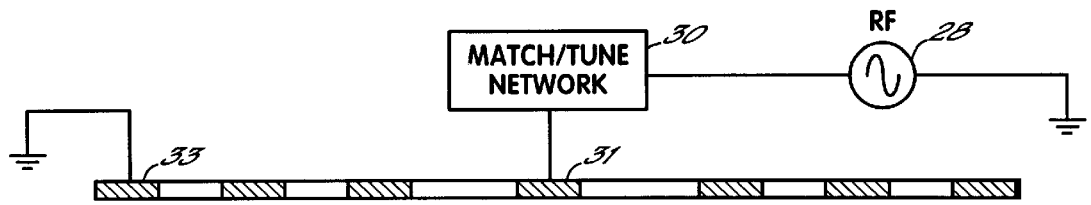
FIGS. 2A and 2B are partial cross-sectional views of apparatus for biasing an inductive coil used in one embodiment of the present invention.
Figure 2B:
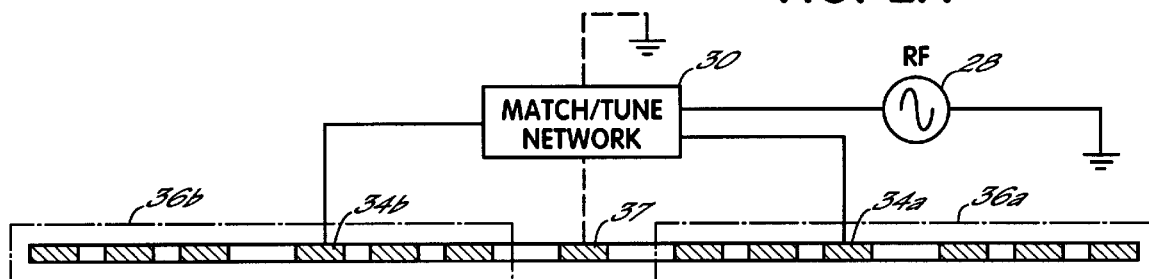

Inductive coil 26 may be a single spiral coil wherein a two lead (RF and ground connection) network is utilized, as illustrated in FIGS. 1 and 2A, with the RF connection coupled to an inward end 31 of the spiral (shown in cross-section) and a ground connection to an outer end 33 of the spiral. Alternatively, as illustrated in FIG. 2B, the coil might include multiple spirals, as illustrated in U.S. patent application Ser. No. 08/624,010, which is biased by a three lead, symmetrically fed system (two RF and one ground connection). Referring to FIG. 2B, the RF power supply 28 and match/tuner network 30 are coupled to inward ends 34a, 34b of the adjacent spirals 36a, 36b, and a ground connection is provided to a point on a connecting leg 37 between the adjacent coils 36a, 36b. Alternatively, a shaped coil might be utilized as disclosed in U.S. Pat. No. 5,556,521. In any case, the coil 26 provides a high-density plasma in the source region 12 for processing a substrate.

For efficient transfer of inductive RF energy into source region 12, the top portion of chamber 10 is terminated by a dielectric plate or window 40. The dielectric window 40 is made of quartz or some other suitable dielectric material which is transparent to RF fields from coil 26. The RF field from the coil 26 propagates through the window 40 and into the source region 12 of chamber 10. One particular dielectric window of the present invention might be a shaped window as illustrated and disclosed in U.S. Pat. No. 5,556,521. Alternatively, other shaped windows, such as a flat window 40 as shown in FIG. 1, might be utilized.

A process or working gas (e.g., Argon, Neon, $CF_4$, $C_2F_6$, $O_2$, $H_2$, or a combination thereof) is supplied to source region 12 via the gas feed ring 24. The preferable inside diameter of the chamber might vary from approximately 4 inches to approximately 20 inches, depending upon the application and the operating pressure that is desired. The processing region is generally larger than the plasma region. A suitable vacuum pressure is created within chamber 10 by a vacuum pump system 42 coupled to chamber 10 proximate processing region. For high-density plasmas like that yielded by the present invention, low pressures, often less than 20 mTorr, are desired. Accordingly, vacuum pump system 42 is operable for yielding such low pressures in the chamber.

To achieve a radially uniform plasma density profile in source region 12, a large diameter source region is desirable. However, as the source region diameter is increased, its volume is increased, and therefore, more power is needed to achieve a desired plasma density. In order to improve the plasma confinement and increase its density in the source region, a magnetic structure or magnetic bucket 44 may be utilized. The magnetic bucket 44 surrounds a portion of the outside of chamber 10 proximate plasma source region 12. Since chamber 10 is non-magnetic, the magnetic bucket will affect the plasma in source region 12. One suitable example of such a magnetic bucket 44 is a magnetic multi-polar structure having vertically aligned, elongated magnetic regions with the aligned regions being of alternating polarities around the circumference of the bucket. Such a structure, is more particularly disclosed in co-pending U.S. patent application Ser. No. 08/624,010. Utilizing such a magnetic multi-polar bucket, the residence time of the electrons in the source region is increased, and their loss rate is reduced. The reduced loss rate increases the plasma density near the boundaries of coil 40 where the plasma density tends to be thinnest. The increased plasma density at the boundaries yields better plasma uniformity and better process uniformity.

Figure 3:
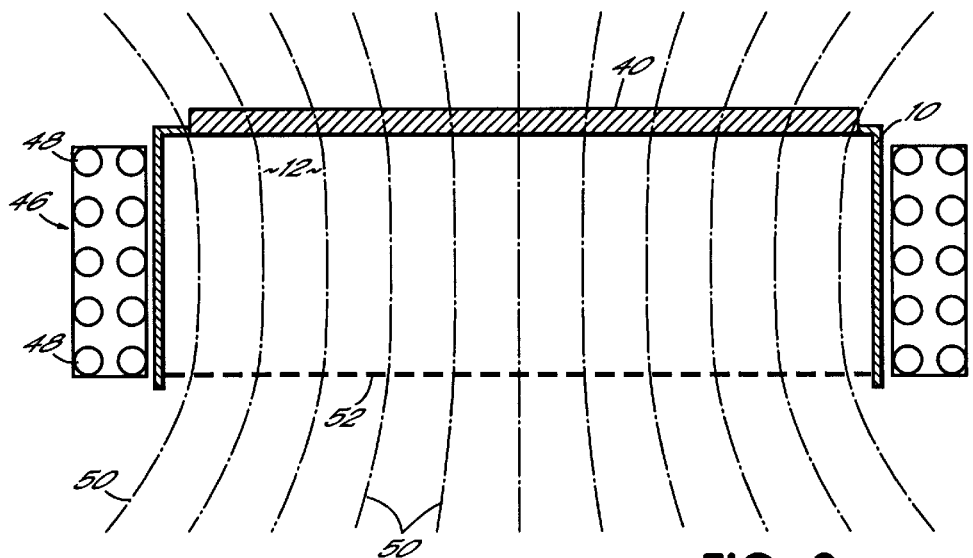
FIG. 3 is a cross-sectional view of a magnetic bucket for directing the plasma from a source region to a processing region to process a substrate in accordance with the principles of the invention.

An alternative embodiment of the magnetic bucket is illustrated in FIG. 3. Bucket 46 includes a set of circular conductor loops 48 surrounding source region 12. Current is directed through the conductor loops 48 by an energy source (not shown) and a magnetic field as indicated by field lines 50 is formed in the source region 12. The conductor loops 48 of bucket 46 are biased such that the field lines magnetically confine the plasma and direct the ionized plasma species toward the downstream processing region 14. Bucket 46 improves the extraction of the plasma ions from the source region and delivery into the processing region and generally enhances the ion extraction of the invention as discussed in greater detail hereinbelow.

A magnetic bucket, or other magnetic structure, might also be utilized proximate a portion of the chamber 10 downstream from the plasma source region 12, such as proximate processing region 14. The bucket 45 influences the plasma in the processing region proximate substrate 18 to provide for improved plasma uniformity and extraction of plasma ions. Alternatively, the separate buckets proximate different portions of the chamber might be combined into a unitary structure.

Figure 4A:
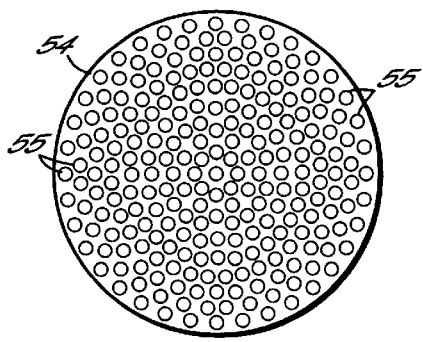
FIG. 4A is one embodiment of an ion extraction mechanism of the present invention while 4B is an alternative embodiment of the plasma extraction mechanism of the invention.

In accordance with the principles of the present invention, an ion extraction or directing mechanism 52 is utilized for extracting and directing ions from the plasma in source region 12 and delivering the ions to the processing region 14 to process substrate 18. Referring to FIG. 4, one embodiment of the extraction mechanism of the invention comprises a conductive plate 54 having a plurality of apertures 55 formed therein for passing plasma from source region 12 to processing region 14 through plate 54. Plate 43 is preferably thin and has a thickness dimension of approximately 0.25–5 cm.

The diameter dimensions of the plate will depend upon the dimensions of the source region 12 in the chamber 10. For example, a suitable diameter for a circular plate might be the same as that of the chamber, although the shape of plate 54 might be other than circular as illustrated.

The shape of the apertures 55 may be circular or can be of any other suitable shape, such as square or polygonal. The conductive plate 54 is preferably coupled to a DC power supply 56, which can be operated in a unipolar or bipolar mode for applying a net negative voltage to the plate. The negatively biased plate 54 attracts the positively biased plasma ions 57 from a plasma in source region 12 and propels the ions toward substrate surface 20 to process the surface. After passing through the plate, the ions have a substantial amount of energy as they enter processing region 14 and possibly impinge upon or bombard substrate surface 20. The ion extraction mechanism, such as plate 54, is made of a conductive material which preferably has a low sputtering yield to prevent excess sputter etching of it during extraction of ions 57 from the plasma in source region 12. For example, the plate 54 may be formed of stainless steel with a number of small apertures 55 bored therein to allow for the passage of plasma species to the processing region. Preferably, the sizes of the apertures 55 in the ion extraction mechanism should be larger than a plasma Debye length, or a diffusion length of the plasma, so that the extraction mechanism 52 does not substantially interfere with the plasma and instead allows for free passage of the plasma species therethrough. The size of the apertures will thus depend upon the plasma density.

Figure 4B:
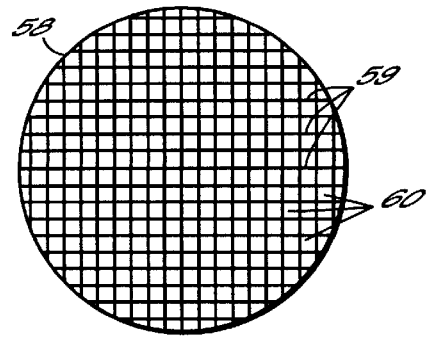

FIG. 4B illustrates an alternative embodiment of the plasma extraction mechanism 52. An extraction grid 58 is formed from a plurality of cross-meshed stainless steel wires 59, which define a plurality of openings 60 therein for passing plasma from the source region through the grid and into the processing region 14. The grid is preferably planar and the openings 60 will be dimensioned as discussed above.

In yet another embodiment, a number of extraction plates can be used in a parallel, stacked formation in such a manner that each plate is biased at a different potential. For example, in a 3-plate extraction mechanism, the first plate can be grounded, the second positively biased, and the third negatively biased (see FIG. 5).

Figure 5:
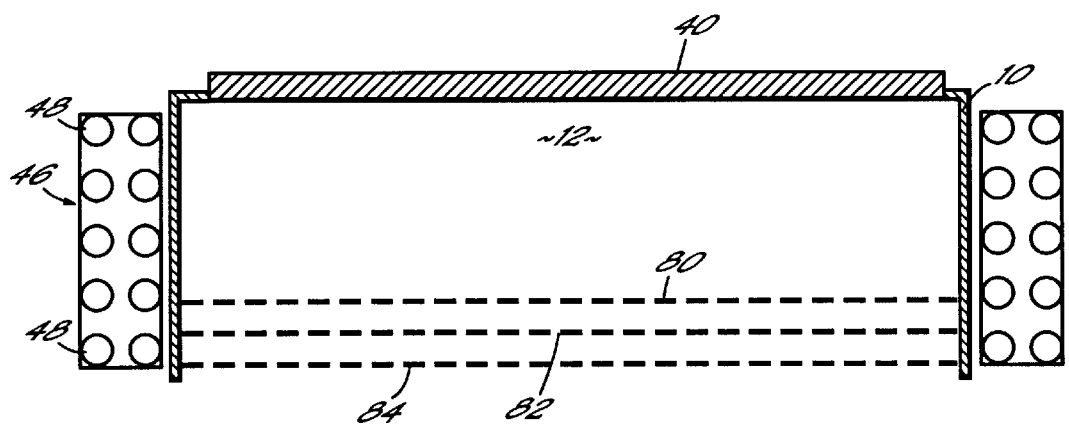
FIG. 5 is a cross-sectional view of another invention embodiment.

Referring to FIG. 5, the invention might utilize a plurality of elements, such as a plurality of plates and grids, positioned in a stacked formation between the source region 12 and processing region 14. For example, elements 80, 82, and 84 may be positioned one over the other and generally parallel to one another as shown in FIG. 5. Furthermore, the elements may be electrically biased differently from one another with at least two of the elements having different potentials. For example, element 80 might be grounded, element 82 might be positively biased, and element 84 might be negatively biased.

In accordance with one aspect of the ion extraction mechanism 52 of the present invention, the biased mechanism extracts ions from source region 12 and delivers them at high energy to the processing region 14 for processing substrate 18. In addition, charge-exchange collisions between the extracted ions and neutral particles of the processing gas in the processing chamber produce a population of directed neutral particles which bombard surface 20 of substrate 18, and in accordance with one aspect of the invention, may be utilized to etch surface 20.

For further control of the energy level of the plasma process at surface 20, wafer support 16 is coupled to RF power supply 22 and applies a bias to substrate 18 to control the plasma ion energy delivered thereto. RF power supply 22 is coupled to substrate support 16 through a match/tuner network 23 for efficient RF power coupling to the substrate. RF power supply 22 may be pulsed or continuous, as desired, for use in the present invention. Substrate 18 may also be coupled through support 16 to a unipolar or multipolar DC biased power supply (not shown), in which case a match/tuner network 23 might not be necessary. The RF power supply frequency can take a value from well below the ion plasma frequency to well above the ion plasma frequency, depending upon the application. The purpose of either a DC or RF power supply is to induce a net negative voltage on the substrate such that ion energies are controlled as they arrive to substrate surface 20.

The present invention is suitable for a number of different etching processes, such as reactive etching or sputter etching, and may be utilized to provide a low-damage and highly directional or anisotropic etch of substrate surface 20. For reactive processing, such as a plasma-enhanced reactive etching, an inert gas such as argon can be fed into the source region 12 to create a dense plasma therein. The ions of the plasma are then extracted and a second reactant gas is introduced into the downstream processing region. For doing so, processing chamber 10 includes another gas feed or gas introduction system, which is a gas feed ring 70, for introducing the reactant gas. The plasma provides energy to the reactive gas and reaction process on surface 20 to etch the surface as is well known in the art.

Plasma processing chambers generally require routine cleaning and maintenance at regular intervals. To that end, a removable sleeve 62, such as a removable quartz sleeve, is inserted into source region 12 to surround the region and protect the inner chamber walls from material which is dislodged from substrate 18, such as through sputter etching. Quartz sleeve 62 can be removed and cleaned or replaced at regular maintenance intervals as desired.

In another aspect of the present invention, a sputter etching application may be achieved by introducing an inert gas such as Argon into both the source region and the processing region. The gas dispersing or introduction element, such as feed ring 70, introduces or disperses the process gas into the processing region 14 to intersect paths of the high-energy extracted ions 57. The generally neutral process gas particles are indicated in FIG. 1 by reference numeral 72. In accordance with the principles of the present invention, a charge exchange occurs between the high-energy ions 57 and the neutral particles of the process gas 72, thus converting the high-energy ion particles into high-energy, neutral particles for bombarding substrate 18, and particularly surface 20, to etch the surface. The invention produces a large number of high-energy, neutral gas species as the result of the charge exchange collisions between the source plasma ions 57 and the downstream neutral species 72 in accordance with the principles of the invention. The etch provided by the high-energy neutral species created by the invention is highly directional or anisotropic, and thus is suitable for advanced etching applications wherein narrow, high aspect ratio structures need to be etched with a directional etch. Furthermore, neutral species reduce the ionic damage which occurs in the IC devices on surface 20. The low-damage, anisotropic processing provided by the invention is particularly suited to VLSI and ULSI processing wherein device sizes continue to decrease. While sputter etching may be achieved utilizing an inert process gas in both the source region and the processing region, a reactant gas in the processing region might be similarly utilized for yielding a plasma enhanced reactive etching process for achieving a directional or anisotropic reactive etching process on surface 20.

In accordance with another aspect of the present invention, harmful radiation, such as UV radiation, is attenuated between the plasma source region 12 and the processing region 14 for reducing the radiation damage to devices on the substrate 18. As mentioned above, the radiation generated by a plasma discharge or plasma glow can detrimentally affect the construction and operation of IC devices on substrate 18, such as by causing undesirable current flow in the devices, semiconductor junction leakage, minority carrier lifetime degradation, and interfacial conductor states within the interface of a device. Overall, the characteristics of the devices may be detrimentally affected or permanently damaged due to such radiation. Radiation damage is increased with the density of the plasma, and is thus a particular problem with high-density plasmas of the kind discussed herein.

The invention comprises a radiation blocking apparatus 80 positioned between the plasma source region 12 and the processing region 14. The radiation blocking apparatus 80 is operable for absorbing radiation produced by the plasma in the source region to reduce radiation damage to substrate 20. In one embodiment of the invention, the radiation blocking apparatus comprises a planar plate having a plurality of apertures 82 formed therein for passing plasma from the source region and into the processing region while absorbing radiation from the plasma. In a preferred embodiment of the invention, the planar plate is formed of a quartz material which has UV radiation blocking capabilities. The ion extraction mechanism 52 in the form of a plate or grid, as disclosed herein, also provides for some blockage of UV radiation. The combination of the ion extraction mechanism and the radiation blocking mechanism provides reduced radiation at substrate 20 and thus reduces the damage to IC devices on the substrate. Preferably, the plate 80 is planar in shape and is positioned generally parallel to substrate surface 20 between source region 12 and processing region 14, generally below the ion extraction mechanism 52. The plate 80 is preferably positioned close to ion extraction mechanism 52 and preferably has a similar shape, such as a circular shape, as the ion extraction mechanism plate shown in FIG. 4A, and will also generally have a similar diameter or other dimension for being mounted in the chamber 10. The apertures 82 may take a plurality of shapes, such as circular or square, and are large enough so as to provide relatively unhindered passage of the plasma therethrough. In FIG. 1, the apertures 82 of the radiation blocking plate are shown larger than the apertures in the ion extracting mechanism only to illustrate the different mechanisms. In fact, the blocking plate 80 and extraction mechanism 52 may have similarly shaped and dimensioned apertures.

The present invention thus provides a low-damage, anisotropic processing apparatus and method for effectively using high-density plasmas. The invention is particularly useful for VLSI and ULSI processing of substrates having narrow, high-aspect ratio device features.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicant's general inventive concept.

What is claimed is:

1. An apparatus for processing a surface of a substrate with a plasma formed from a process gas, comprising:

a processing chamber defining therein a plasma source region and a plasma processing region located downstream of the source region, the processing region configured to contain a substrate to be processed;

an electrical energy source operably coupled to the chamber for directing energy into the source region to form and sustain a plasma therein;

an ion directing mechanism positioned between the source region and the processing region, the ion directing mechanism operable, when biased with electrical energy, for extracting ions from the plasma in the source region and directing high-energy extracted ions directly into the processing region for processing a substrate therein;

a gas introduction element positioned in the processing region downstream of the plasma source region and downstream of the ion directing mechanism and directly proximate thereto, the gas introduction element operable for dispersing an unexcited process gas into the processing region directly proximate the substrate to intersect paths of the high-energy directed ions and produce a charge exchange between the ions and particles of the process gas directly proximate the substrate for creating a large number of high-energy neutral particles for processing a substrate;

whereby a low-damage and directional processing of the substrate is achieved.

2. The apparatus of claim 1 wherein the gas introduction element is operable for creating a pressure differential between the source region and the processing region for increasing the rate of charge exchange between the high-energy ions and the neutral particles and increasing the density of high-energy neutral particles.

3. The apparatus of claim 1 wherein the ion extraction mechanism comprises at least one conductive plate having a plurality of apertures formed therein for passing the plasma from the source region, through the plate and into the processing region.

4. The apparatus of claim 1 wherein the ion extraction mechanism comprises at least one conductive grid defining a plurality of openings therein for passing the plasma from the source region, through the grid and into the processing region.

5. The apparatus of claim 1 wherein said extraction mechanism further comprises at least one conductive element and an energy source coupled to the element for biasing the element to attract ions from the plasma.

6. The apparatus of claim 5 wherein the conductive element is formed of stainless steel.

7. The apparatus of claim 1 further comprising a radiation blocking apparatus positioned between the plasma source region and the processing region, the radiation blocking apparatus operable for absorbing radiation produced by the plasma in the source region to reduce the amount of radiation falling on the substrate.

8. The apparatus of claim 7 wherein the radiation blocking apparatus comprises a grid having a plurality of apertures formed therein for passing plasma from the source region, through the radiation blocking grid and into the processing region while absorbing radiation from the plasma.

9. The apparatus of claim 8 wherein the grid is formed of quartz.

10. The apparatus of claim 1 further comprising a magnetic bucket surrounding a portion of the plasma source, the bucket operable for magnetically influencing the plasma to produce a high density plasma.

11. The apparatus of claim 1 further comprising a magnetic bucket surrounding a portion of the plasma source, the bucket operable for magnetically influencing the plasma to direct the plasma toward the ion extraction apparatus.

12. The apparatus of claim 1, further comprising a magnetic bucket surrounding a portion of the plasma processing region.

13. The apparatus of claim 1 wherein the electrical energy source comprises an RF biased spiral coil for coupling energy into the source region.

14. The apparatus of claim 1 wherein the ion extraction mechanism comprises a plurality of conductive elements generally positioned in a stacked formation for extracting ions.

15. The apparatus of claim 14, wherein at least two of said plurality of stacked conductive elements are electrically biased at different potentials from each other.

16. An apparatus for processing a surface of a substrate with a plasma formed from a process gas, comprising:

- a processing chamber defining therein a plasma source region and a plasma processing region located downstream of the source region, the processing region configured to contain a substrate to be processed;
- an electrical energy source operably coupled to the chamber for directing energy into the source region to form and sustain a plasma therein which generates radiation;
- an ion directing mechanism positioned between the source region and the processing region, the ion directing mechanism operable, when biased with electrical energy, for extracting ions from the plasma in the source region and directing high-energy extracted ions directly into the processing region for processing a substrate therein;
- a gas introduction element positioned in the processing region downstream of the plasma source region and downstream of the ion directing mechanism and directly proximate thereto, the gas introduction element operable for dispersing a process gas into the processing region to intersect paths of the high-energy directed ions and produce a charge exchange between the ions and particles of the process gas directly proximate the substrate for creating a large number of high-energy neutral particles for processing a substrate;
- a radiation blocking apparatus positioned between the plasma source region and the processing region, the radiation blocking apparatus operable for absorbing radiation produced by the plasma in the source region to reduce the damage to the substrate,
- whereby low-damage and directional processing of the substrate is achieved.

17. The apparatus of claim 16 wherein the ion directing mechanism comprises at least one plate having a plurality of apertures formed therein for passing the plasma from the source region, through the plate and into the processing region.

18. The apparatus of claim 16, wherein the ion directing mechanism comprises at least one grid defining a plurality of openings therein for passing the plasma from the source region, through the grid and into the processing region.

19. The apparatus of claim 16 wherein the radiation blocking apparatus comprises a plate having a plurality of apertures formed therein for passing plasma from the source region, through the radiation blocking grid and into the processing region while absorbing radiation from the plasma.

20. The apparatus of claim 19 wherein the plate is formed of quartz.

21. The apparatus of claim 16 wherein the ion directing mechanism comprises a plurality of conductive elements generally positioned in a stacked formation.

* * * * *

UNITED STATES PATENT AND TRADEMARK OFFICE
CERTIFICATE OF CORRECTION

PATENT NO. : 6,083,363
DATED : July 4, 2000
INVENTOR(S) : Kaihan A. Ashtiani and James A. Seirmarco It is certified that error appears in the above-identified patent and that said Letters Patent is hereby corrected as shown below:

Column 10, claim 3,
Line 29, delete "extraction" and insert -- directing --.

Column 10, claim 4,
Line 34, delete "extraction" and insert -- directing --.
Line 48, delete "extraction" and insert -- directing --.

Column 11, claim 14,
Line 4, delete "extraction" and insert -- directing --.
Line 7, insert -- and directing -- before "ions".

Signed and Sealed this

Twenty-fifth Day of September, 2001

Attest:

NICHOLAS P. GODICI
Attesting Officer   Acting Director of the United States Patent and Trademark Office